United States Patent [19]

Shakuda

[11] Patent Number: 5,793,405
[45] Date of Patent: Aug. 11, 1998

[54] LED PRINTHEAD, LED ARRAY CHIP THEREFOR AND METHOD OF MAKING LED ARRAY CHIP

[75] Inventor: Yukio Shakuda, Kyoto, Japan

[73] Assignee: Rohm Co. Ltd., Kyoto, Japan

[21] Appl. No.: 518,361

[22] Filed: Aug. 23, 1995

[30] Foreign Application Priority Data

Aug. 24, 1994 [JP] Japan .................. 6-199345

[51] Int. Cl.[6] .................. B41J 2/45; B41J 2/47; G01D 15/14
[52] U.S. Cl. .................. 347/238; 347/241
[58] Field of Search .................. 347/238, 237, 347/241; 257/81, 84, 88, 77

[56] References Cited

U.S. PATENT DOCUMENTS

| | | | |
|---|---|---|---|
| 4,378,149 | 3/1983 | Ebner | 354/5 |
| 4,734,723 | 3/1988 | Ishitobi | 347/234 |
| 5,162,878 | 11/1992 | Sasagawa et al. | 257/88 |
| 5,182,757 | 1/1993 | Mori et al. | 372/45 |
| 5,300,954 | 4/1994 | Murano et al. | 347/130 |
| 5,496,766 | 3/1996 | Amano et al. | 437/127 |
| 5,585,648 | 12/1996 | Tischler | 257/77 |
| 5,592,501 | 1/1997 | Edmond et al. | 257/77 |

Primary Examiner—N. Le
Assistant Examiner—Thinh Nguyen
Attorney, Agent, or Firm—Michael D. Bednarek; Kilpatrick Stockton LLP

[57] ABSTRACT

An LED printhead is provided which comprises at least one LED chip having a plurality of light emitting portions, and drive at least one drive IC for selectively actuating the light emitting portions of the LED chip for light emission. Each of the light emitting portions includes a laminate of gallium nitride compound semiconductor layers formed on a surface of an insulating substrate. The light emitting portions are made to emit light having a wavelength of no more than 550 nm.

4 Claims, 8 Drawing Sheets

LED PRINTHEAD, LED ARRAY CHIP THEREFOR AND METHOD OF MAKING LED ARRAY CHIP

BACKGROUND OF THE INVENTION

1. Field of the Invention

This invention relates to an LED printhead which operates by causing chemical reaction on a photosensitive medium. The present invention also relates to an LED array chip incorporated in such an LED printhead, and a method of making an LED array chip.

2. Description of the Related Art

In general, an LED printhead comprises a plurality of LED array chips for providing an array of luminous dots, and a plurality of drive ICs for actuating the LED array chips, whereby the luminous dots are selectively activated for light emission in accordance with the supplied printing data. The light from the luminous dots passes through an optical lens system for focusing on the surface of a photosensitive medium in an electrophotographic process, thereby causing a chemical change on the photosensitive medium surface.

In a typical prior art LED printhead, a plurality of elongate or rectangular LED array chips are mounted in an array on a circuit board together with a parallel array of drive ICs electrically connected to the LED array chips. Each LED array chip includes a laminate of Ga-As compound semiconductor layers for example. An array of luminous dots is formed by diffusion of P-type impurities into the surface layer of the laminate at portions thereof which are constantly spaced longitudinally of the chip. When actuated, each luminous dot emits light having a wavelength of normally about 780 nm (which corresponds to red or infrared light).

With the prior art LED printhead, the wavelength of light emitted by the LED array chip is relatively large (about 780 nm). Since the amount of energy is known to decrease with increasing wavelength of light, the prior art LED printhead poses a great limitation on the selection of applicable materials for the photosensitive medium. If the material selected for the photosensitive medium is not sufficiently sensitive to low energy light (namely, large wavelength light), well-defined or sharp sentitization of the photosensitive medium becomes difficult, thereby failing to provide a good printing quality.

Further, the prior art LED printhead is also disadvantageous in that formation of luminous dots by impurity diffusion is rather time-taking and troublesome.

SUMMARY OF THE INVENTION

It is, therefore, an object of the present invention to provide an LED printhead which provides a high sentitizing effect relative to a photosensitive medium, thereby increasing the freedom in selecting the material for the photosensitive medium.

Another object of the present invention is provide an LED array chip which can be advantageously incorporated in such a printhead.

A further object of the present invention is to provide a method of advantageously making such an LED array chip.

According to one aspect of the present invention, there is provided an LED printhead comprising:

at least one LED chip having a plurality of light emitting portions, each of the light emitting portions including a laminate of gallium nitride compound semiconductor layers formed on a surface of an insulating substrate; and drive means for selectively actuating the light emitting portions of the LED chip for light emission;

wherein the light emitting portions are made to emit light having a wavelength of no more than 550 nm.

Preferably, the laminate comprises an N-type GaN layer, an N-type $Al_{0.2}Ga_{0.8}N$ layer, an $In_{0.15}Ga_{0.85}N$ layer as a light emitting layer, a F-type $Al_{0.2}Ga_{0.8}N$ layer, and a P-type GaN layer, all of which are successively formed in the mentioned order from the substrate. Further, it is advantageous if the N-type GaN layer and the N-type $Al_{0.2}Ga_{0.8}N$ layer contain silicon as an additive, whereas the P-type $Al_{0.2}Ga_{0.8}N$ layer and the P-type GaN layer contain magnesium as an additive. The $In_{0.15}Ga_{0.85}N$ light emitting layer may contain zinc as an additive.

According to one embodiment, the LED chip and the drive means are mounted on a common circuit board, and the circuit board is interposed between a cover member and a heat sink plate. In this case, the cover member may carry a lens array in facing relation to the LED chip. Further, the cover member and the heat sink plate may be held together by at least one channel-like spring member.

According to another embodiment of the present invention, the LED chip and the drive means are commonly mounted on an optical fiber array plate which has a plate body and an embedded optical fiber array portion in facing relation to the LED chip, wherein the optical fiber array portion includes a multiplicity of optical fibers extending in a thickness direction of the plate body.

According to another aspect of the present invention, there is provided an LED array chip comprising:

a common insulating substrate;

at least one LED array chip having a linear array of light emitting portions, each of the light emitting portions including a laminate of gallium nitride compound semiconductor layers formed on a surface of the common insulating substrate;

wherein the light emitting portions are separated from each other by insulating portions.

Preferably, the N-type GaN layer of the laminate is partially exposed for forming a common electrode extending along an entire length of the array of light emitting portions, whereas the P-type GaN layer of the laminate of each light emitting portion is formed with an individual electrode.

According to a further aspect of the present invention, there is provided a method of making an LED array chip comprising:

preparing a common insulating substrate;

forming a linearly extending laminate on a surface of the common substrate, the laminate comprising at least one N-type layer of gallium nitride compound semiconductor, a light emitting layer of gallium nitride compound semiconductor, and at least one F-type layer of gallium nitride compound semiconductor;

annealing the laminate for reducing electrical resistance of the P-type layer;

etching the laminate for dividing the laminate into a plurality of light emitting portions spaced from each other and for partially exposing the N-type layer;

forming an individual electrode on the P-type layer at each of the light emitting portions; and forming a common electrode on the partially exposed N-type layer.

According to still another aspect of the present invention, there is provided a method of making an LED array chip comprising:

preparing a common insulating substrate;

forming a linearly extending laminate on a surface of the common substrate, the laminate comprising at least one N-type layer of gallium nitride compound semiconductor, a light emitting layer of gallium nitride compound semiconductor, and at least one P-type layer of gallium nitride compound semiconductor;

irradiating laser beam toward the laminate only at portions thereof which are spaced along the laminate so that the irradiated portions of the laminate are converted to light emitting portions;

etching the laminate for partially exposing the N-type layer;

forming an individual electrode on the P-type layer at each of the light emitting portions; and forming a common electrode on the partially exposed N-type layer.

Other objects, features and advantages of the present invention will be fully understood from the following detailed description given with reference to the accompanying drawings.

DETAILED DESCRIPTION OF THE PREFERRED EMBODIMENTS

Figure 1:
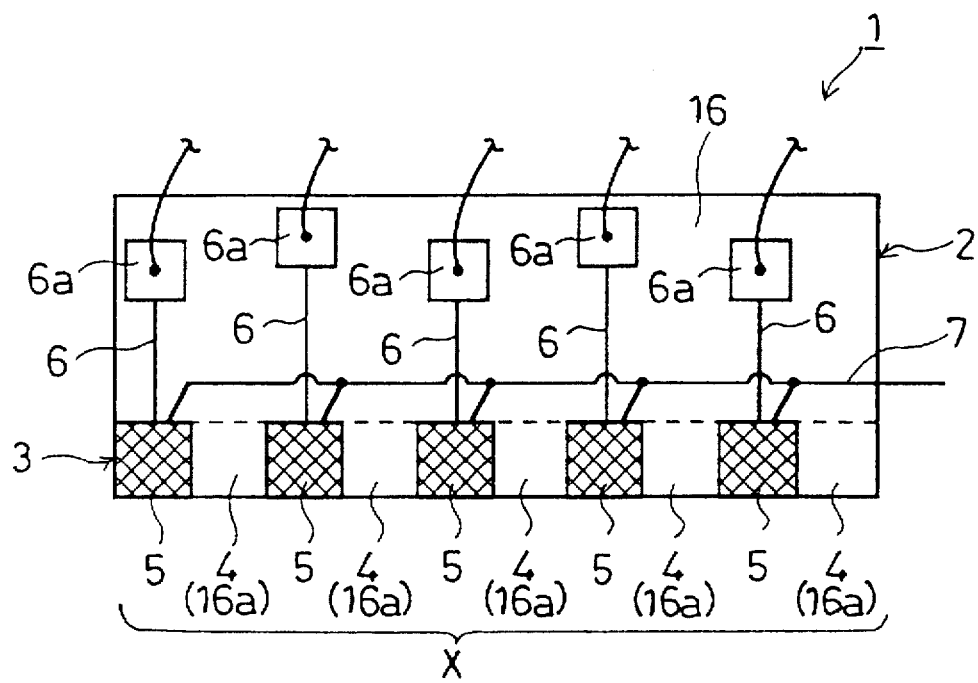
FIG. 1 is a schematic plan view showing an LED array chip embodying the present invention.

Referring first to FIG. 1 of the accompanying drawings, there is schematically shown an LED array chip 1 according to a first embodiment of the present invention. The LED array chip 1 comprises an elongate or rectangular insulating substrate 2 made of transparent sapphire, and a laminate 3 formed longitudinally of the substrate 2. The laminate 3 is divided by a plurality of insulating portions 4 into a plurality of unit light emitting portions 5 to provide an array X of luminous dots extending longitudinally of the substrate 2.

Figure 4:
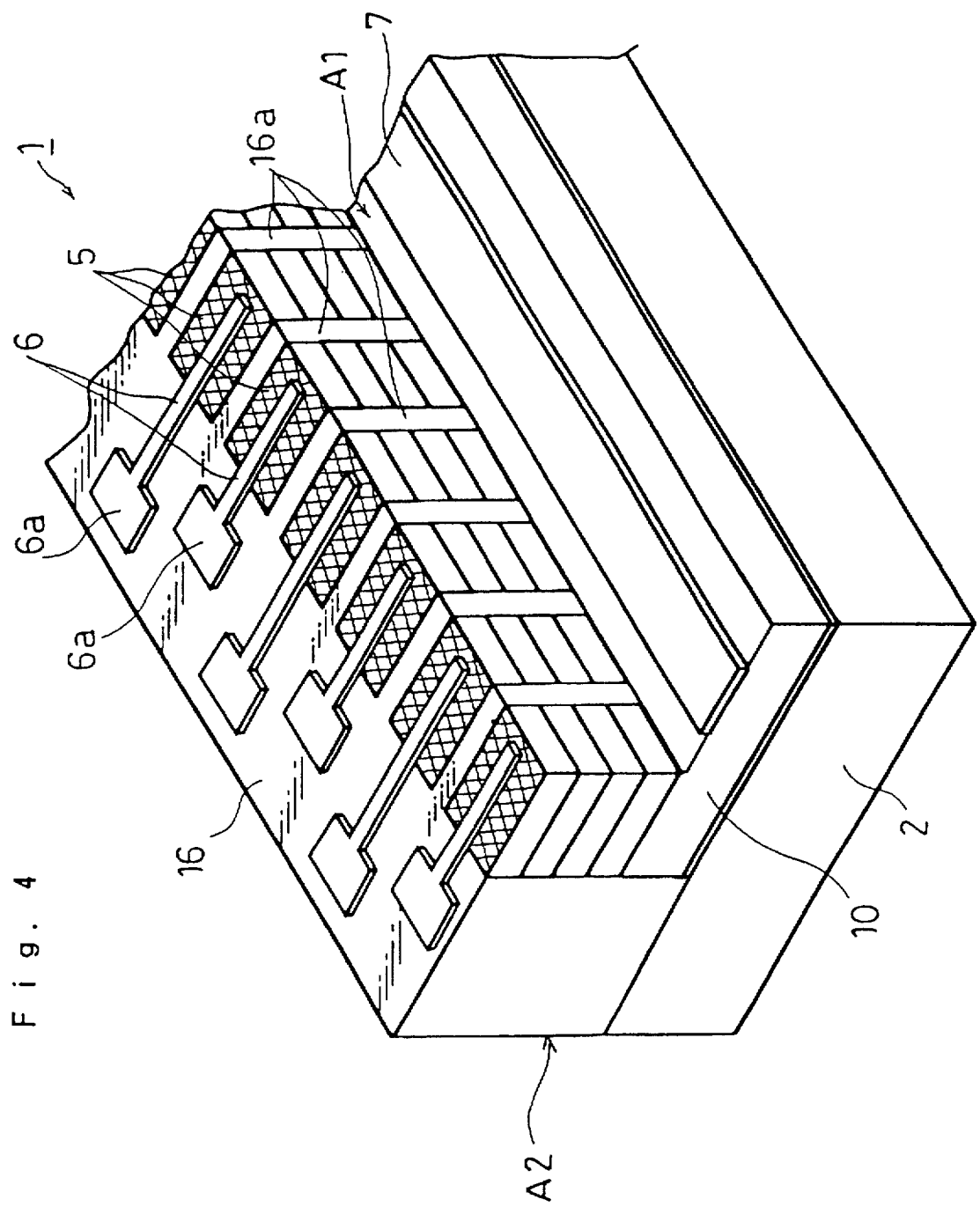
FIG. 4 is a perspective view showing the same chip after finishing the manufacturing process.
Figure 5:
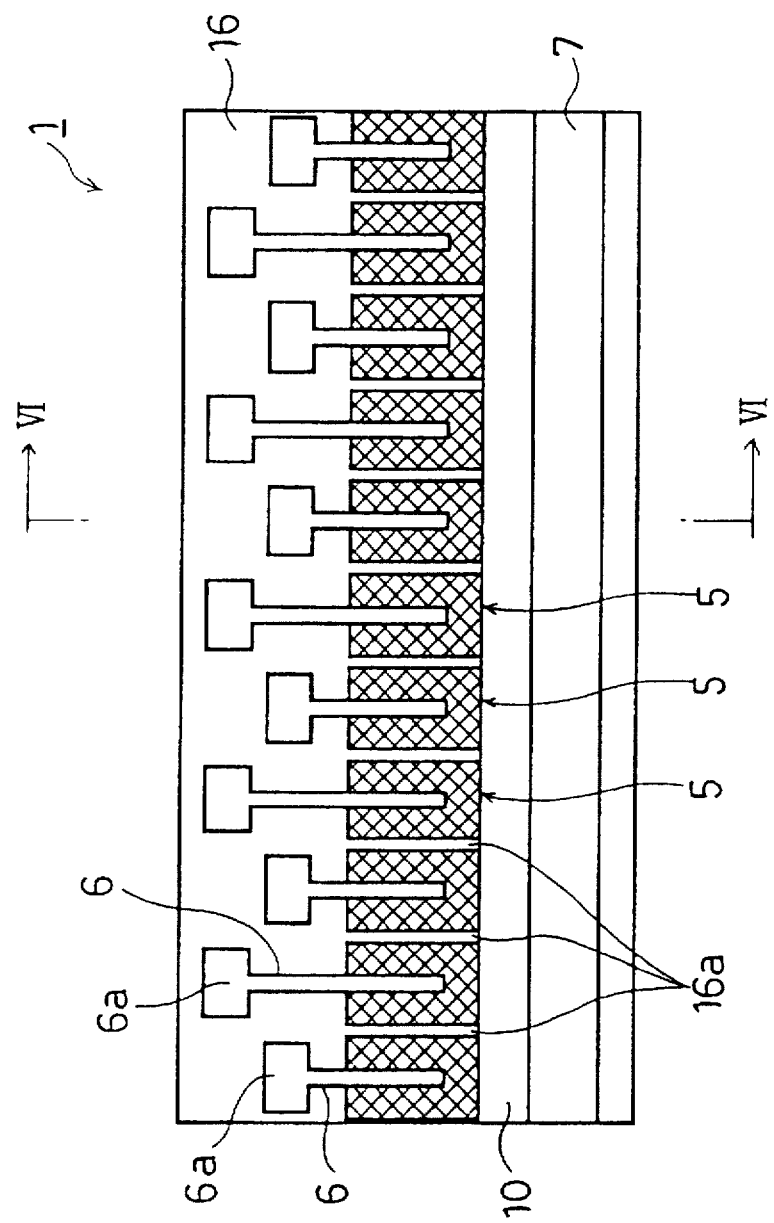
FIG. 5 is a plan view of the same chip.

The LED array chip 1 further comprises a plurality of individual electrodes 6 and a common electrode 7. Each of the individual electrodes 6 is electrically connected at one end to one pole of a corresponding light emitting portion 5 and formed at the other end with a bonding pad 6a. The common electrode 7 is electrically connected to the other pole of each light emitting portion 5. The actual configurations of the individual and common electrodes 7 are shown in FIGS. 4 and 5 to be described later.

Figure 2:
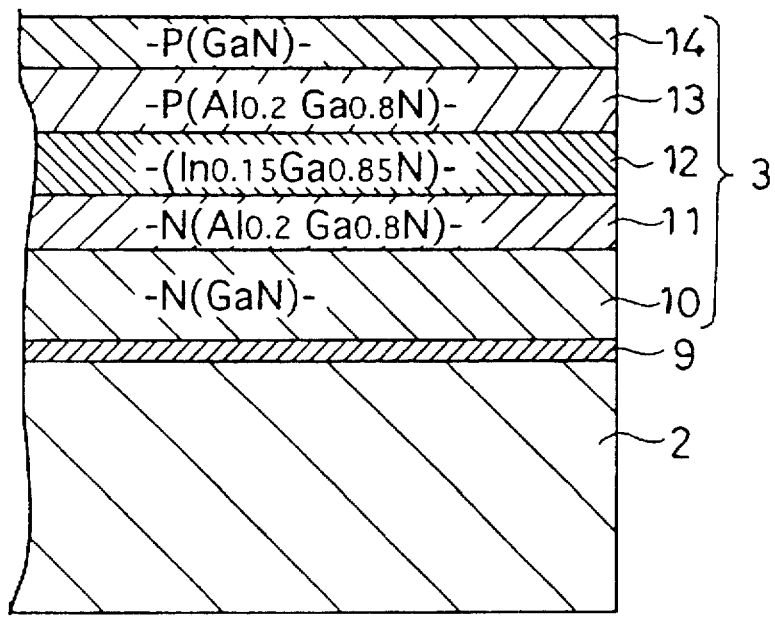
FIG. 2 is a view, in vertical section, showing a laminate structure of the same chip.

In manufacture of the LED array chip 1, a buffer layer 9 of gallium nitride (GaN) is first formed on the substrate 2, and the laminate 3 is then formed on the buffer layer 9, as shown in FIG. 2. The laminate 3 comprises an N-type GaN layer 10, an N-type $Al_{0.2}Ga_{0.8}N$ layer 11, an $In_{0.15}Ga_{0.85}N$ layer 12 as a light emitting layer, a P-type $Al_{0.2}Ga_{0.8}N$ layer 13, and a P-type GaN layer 14, all of which are successively formed by MOCVD (organic metal chemical vapor deposition) in the mentioned order from the buffer layer 9.

According to the present embodiment, the thicknesses of the layers 10, 11, 12, 13 and 14 may be set, respectively, at 3 μm, 300 nm, 50 nm, 300 nm and 150 nm for example. Further, the $In_{0.15}Ga_{0.85}N$ light emitting layer 12 is made to generate blue light which preferably has a wavelength of about 470 nm.

The N-type GaN layer 10 and the N-type $Al_{0.2}Ga_{0.8}N$ layer 11 contain silicon (Si) as an additive, whereas the P-type $Al_{0.2}Ga_{0.8}N$ layer 13 and the P-type GaN layer 14 contain magnesium (Mg) as an additive. Further, the $In_{0.15}Ga_{0.85}N$ light emitting layer 12 contains zinc (Zn) as an additive. If the mixture ratio (mixed crystal ratio) of In to Ga in the light emitting layer 12 increases, the wavelength of the light generated at this layer 12 also increases. Similarly, if the amount of Zn added to the $In_{0.15}Ga_{0.85}N$ layer 12 increases, the wavelength of the light generated at this layer 12 also increases.

After forming the laminate 3, an annealing step is performed for about 20 minutes by placing the combined body of the substrate 2 and laminate 3 in a nitrogen gas atmosphere heated to a temperature of about 700° C. As a result, the P-type semiconductor layers 13, 14 of the laminate 3 is made to have a reduced electrical resistance.

Figure 3:
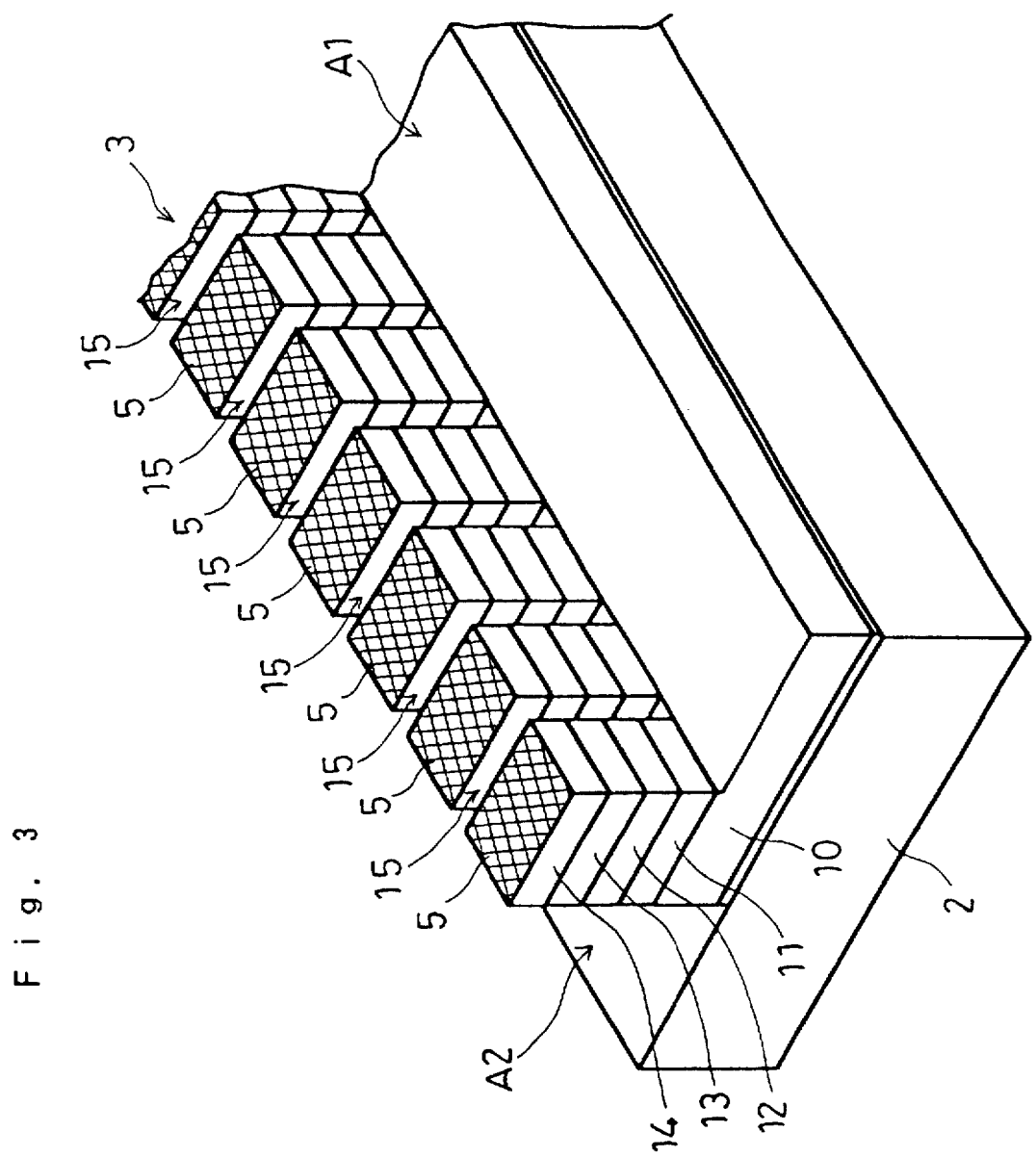
FIG. 3 is a perspective view showing a process step for manufacturing the same chip.

Then, as shown in FIG. 3, an etching step is performed for partially exposing the N-type GaN layer 10 in a first strip-like region A1 extending along one longitudinal edge of the substrate 2, and for partially exposing the substrate 2 in a second strip-like region A2 extending along the other longitudinal edge of the substrate 2. Further, due to the etching step, a plurality of insulating grooves 15 are also formed in the laminate 3 at a constant spacing along the substrate 2, thereby dividing the laminate 3 into the plurality of unit light emitting portions 5.

Then, as shown in FIG. 4, an insulating member 16 having extensions 16a extending into the insulating grooves 15 is formed on the substrate 2 in the second strip-like region A2. The top surface of the insulating member 16 is substantially flush with that of each light emitting portion 5. The insulating member 16 may be made of polyimide resin or $SiO_2$ for example. It should be understood that the extensions 16a formed in the insulating grooves 15 correspond to the insulating portions 4 shown in FIG. 1.

Figure 6:
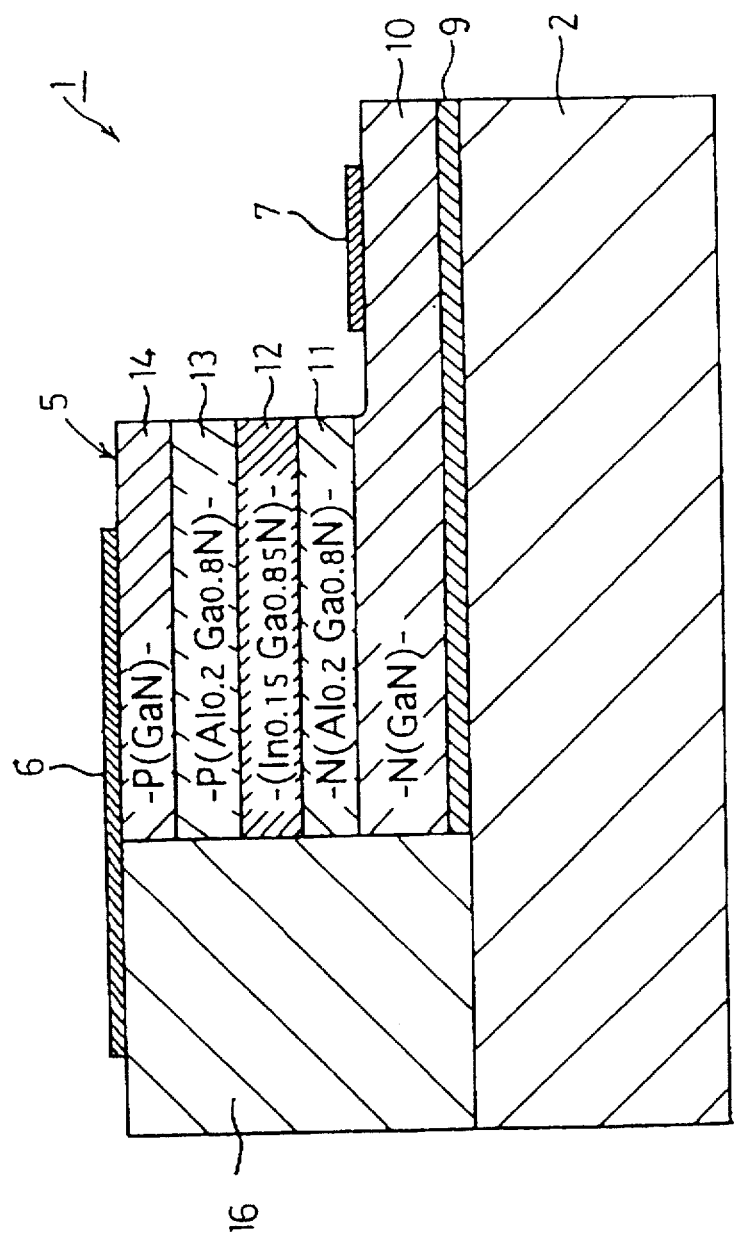
FIG. 6 is a sectional view taken on lines VI—VI in FIG. 5.

Finally, as shown in FIGS. 4–6, the individual electrodes 6 are formed to extend from the insulating member 16 to the light emitting portions 5, respectively, whereas the common electrode 7 is formed on the N-type GaN layer 10 in the first region A1 of the substrate 2. Formation of the respective electrodes 6, 7 may be performed in a known manner. According to the present embodiment, the bonding pads 6a of the individual electrodes 6 are staggered to enable a high density arrangement of the light emitting portions 5 in a limited length of the LED array chip 1.

The above process is described only with respect to the single LED array chip 1. In actual production, however, a plurality of such LED array chips are made together from a common wafer which is later divided into the individual chips by known dicing.

Figure 7:
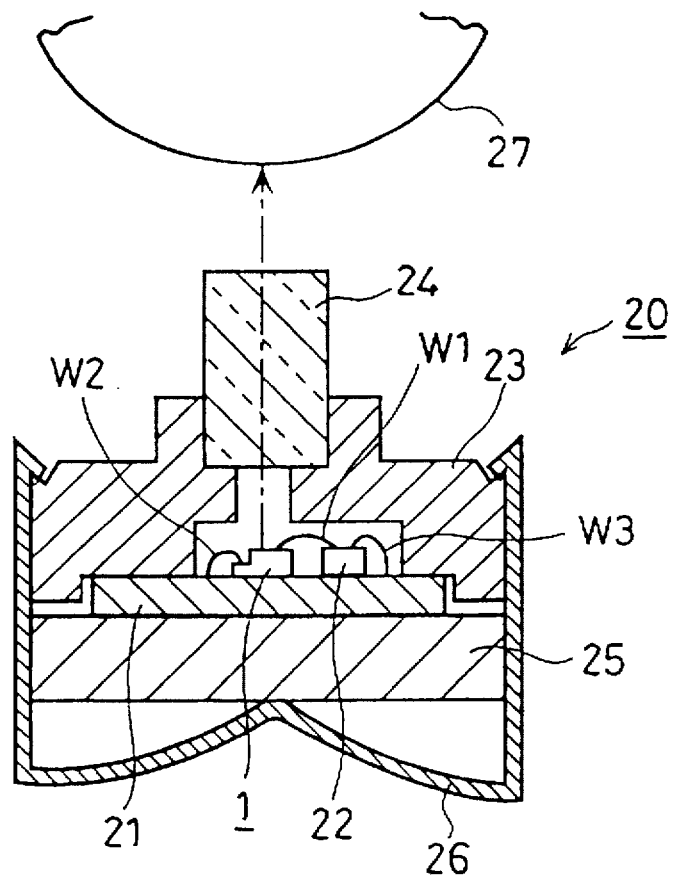
FIG. 7 is a view, in transverse section, showing an example of LED printhead which incorporates the LED array chip shown in FIGS. 1 through 6.

As shown in FIG. 7, a plurality of LED array chips 1 thus obtained may be incorporated in an LED printhead 20. The number of LED array chips 1 to be incorporated in the printhead 20 may be determined depending on the applicable paper size. It should be appreciated that FIG. 7 is a transverse section of the printhead 20.

Specifically, the plurality of LED array chips 1 (only one shown in FIG. 7) are mounted in an array on a common circuit board 21 together with a parallel array of drive ICs 22 (only one shown). The bonding pads 6a (see FIGS. 1, 4 and 5) of the individual electrodes 6 of the respective LED array chips 1 are electrically connected to the corresponding output pads (not shown) of the drive ICs 22 via a first group of bondwires W1. The common electrodes 7 of the respective LED array chips 1 are electrically connected to a grounding conductor pattern (not shown) on the circuit board 21 via a second group of bondwires W2. Further, the input pads (not shown) of the respective drive ICs 22 are electrically connected to a control conductor pattern (not shown) on the circuit board 21 via a third group of bondwires W3.

The circuit board 21 with the respective arrays of LED array chips 1 and drive ICs 22 mounted thereon is covered by a cover member 23 carrying a non-inverting and non-magnifying type lens array 24 in facing relation to the array of LED array chips 1. The circuit board 21 is supported on a heat sink plate 25. The cover member 23 and the heat sink plate 25 are fixed together by a channel-like spring member 26 which may also function as a housing.

In operation of the LED printhead 20, the light emitting portions 5 (FIGS. 1, 4 and 5) of the respective LED array chips 1 are selectively actuated for light emission in accordance with the drive outputs from the respective drive ICs 22. The emitted light passes through the lens array 24 to focus on the surface of a photosensitive medium 27.

According to the present embodiment, the light emitting portions 5 of each LED array chip 1 are made to emit blue light having a short wavelength of preferably about 470 nm, as previously described. Such short wavelength light has been found to facilitate chemical reaction on the surface of the photosensitive medium 27, thereby improving the printing or electrophotographic quality by well-defined sentitization of the photosensitive medium 27. Further, the application of the short wavelength light increases the freedom in selecting the material for the photosensitive medium 27, as opposed to the prior art wherein use is made of long wavelength light (e.g. infrared light) which more reluctantly causes chemical reaction and therefore poses limitations in selecting the photosensitive material.

It should be appreciated that substantially the same advantages as described above can be obtained if the wavelength of light emitted by each LED array chip 1 is no more than 550 nm. Further, the non-magnifying lens array 24 may be replaced by a magnifying or reducing convex lens array.

Figure 8:
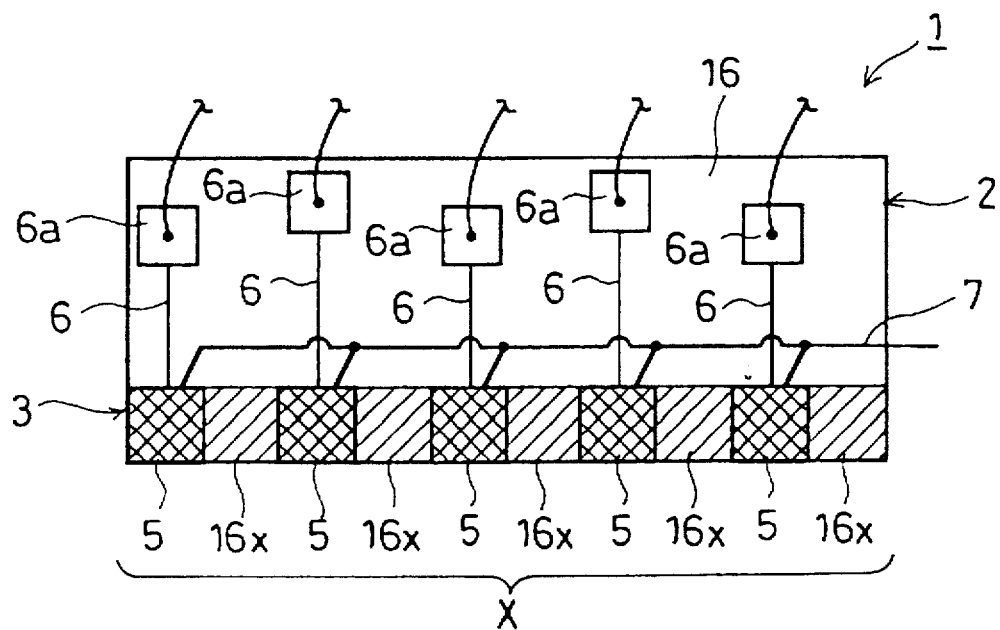
FIG. 8 is a schematic plan view showing another LED array chip embodying the present invention.

FIG. 8 shows an LED array chip 1' according to a second embodiment of the present invention. The LED array chip 1' of this embodiment is similar to that of the first embodiment. Therefore, the same reference signs as used for the LED array chip of the first embodiment are also used to designate the corresponding elements of the LED array chip 1' of the second embodiment.

According to the second embodiment, the laminate 3 is not subjected to an annealing step after its formation.

Instead, the surface of the laminate 3 is subjected to electron beam irradiation only at locations spaced longitudinally of the substrate 2. As a result, the P-type or surface layers 13, 14 at the portions of the laminate 3 which are subjected to electron beam irradiation are made to have a reduced electrical resistance, whereas the P-type layers 13, 14 at the remaining portions of the laminate 3 remain high in electrical resistance.

Thus, the lower resistance portions function as unit light emitting portions 5 to provide an array X of luminous dots, while the higher resistance portions 16x work as insulating portions.

The LED array chip 1' of the second embodiment is otherwise the same as that of the first embodiment. Thus, when incorporated in a LED printer, the LED array chip 1' of the second embodiment enjoys substantially the same advantages as that of the first embodiment.

Figure 9:
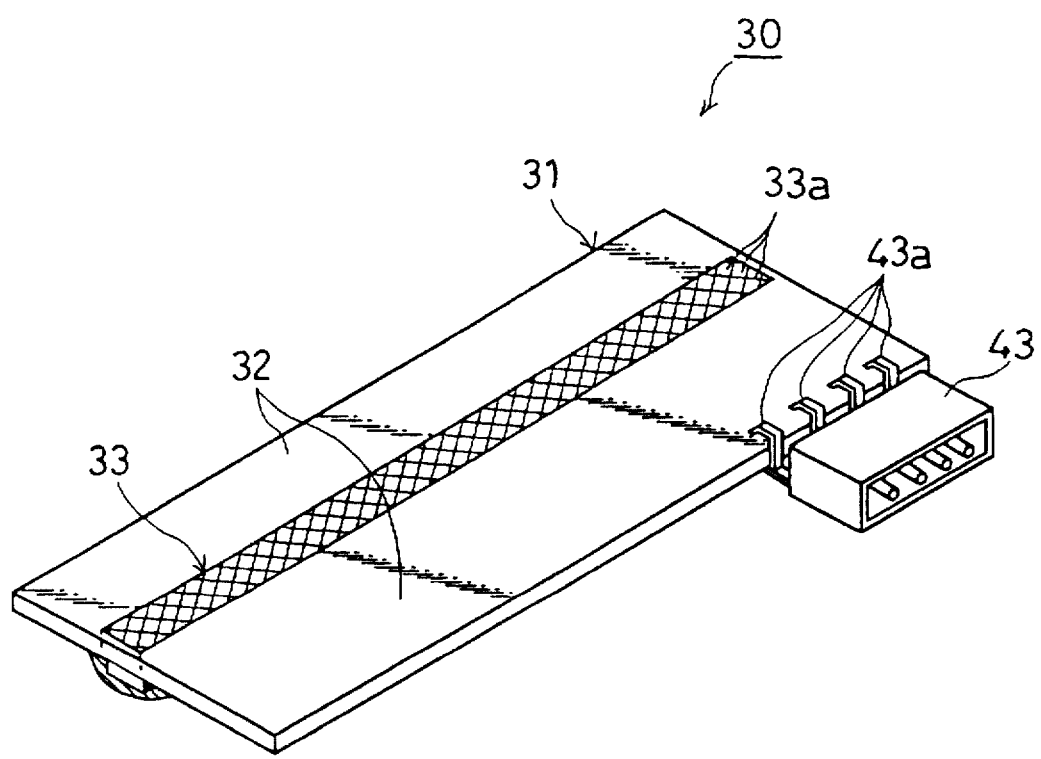
FIG. 9 is a perspective view showing another example of LED printhead which incorporates the LED array chip shown in FIGS. 1 through 6.
Figure 10:
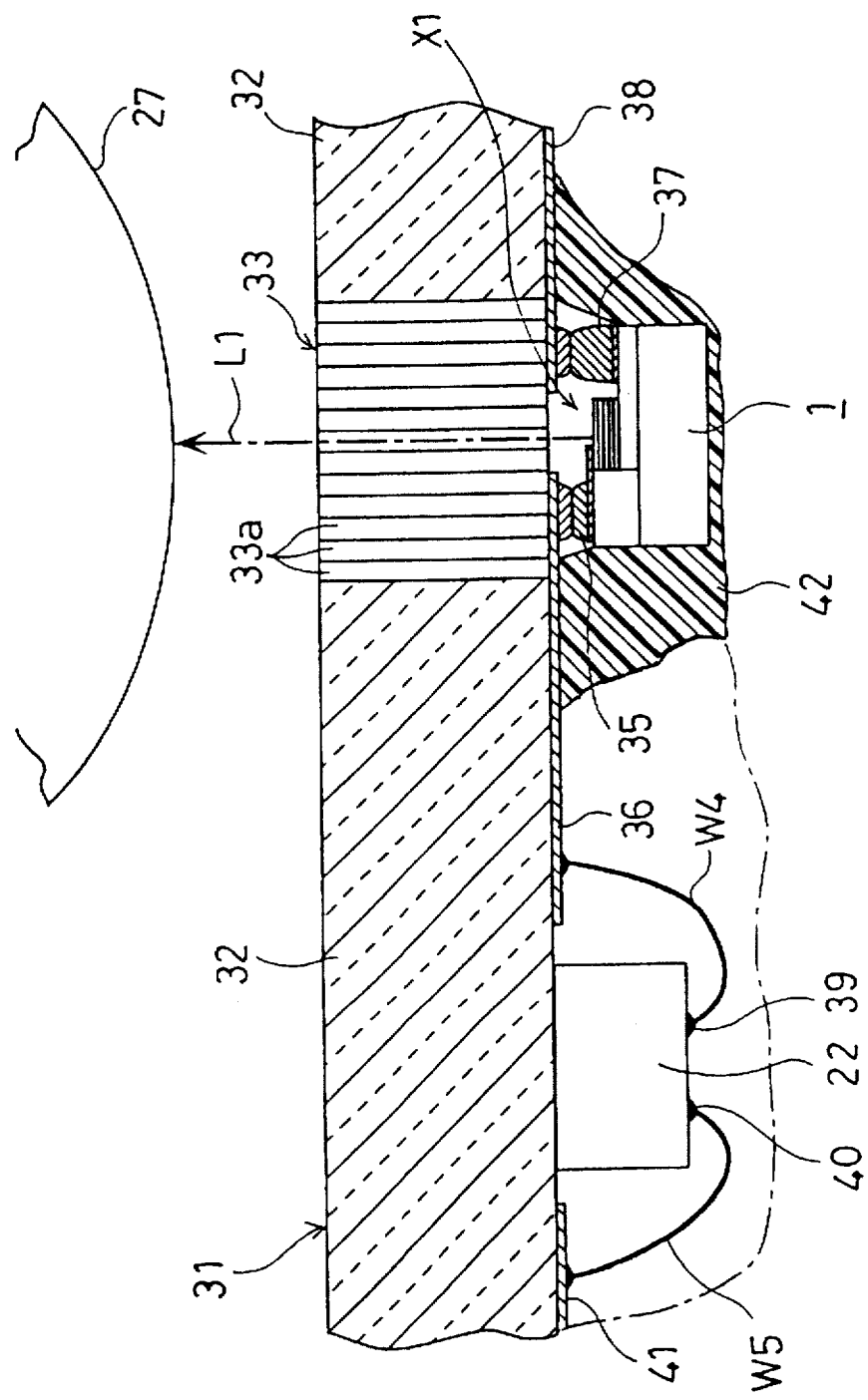
FIG. 10 is a view, in transverse section, showing the LED printhead of FIG. 9.

FIGS. 9 and 10 show another example of LED printhead in which a plurality of LED array chips 1 (each being similar to the one shown in FIGS. 1 through 6) may be incorporated. Specifically, the LED printhead generally designated by reference numeral 30 comprises an optical fiber array plate 31 which works also as a circuit board. The optical fiber array plate 31 has an elongate or rectangular plate body 32 and an embedded optical fiber array portion 33 extending between both longitudinal edges of the plate body 32 in parallel thereto. The optical fiber array portion 33 includes a multiplicity of optical fibers 33a each extending in the thickness direction of the plate body 32. The optical fibers 33a are fixed or bundled together by e.g. a resin material (not shown) filling the interstices between the fibers 33a.

As shown in FIG. 10, the plurality of LED array chips 1 (only one shown in FIG. 10) are mounted in an array on the underside of the optical fiber array plate 31 in facing relation to the optical fiber array portion 33 together with a parallel array of drive ICs 22 (only one shown). The bonding pads 6a (see FIGS. 1, 4 and 5) of the individual electrodes 6 of the respective LED array chips 1 are provided with bumps 35 for electrical connection to an output transmitting conductor pattern 36 formed on the underside of the optical fiber array plate 31. The common electrodes 7 (see FIGS. 1, 4 and 5) of the respective LED array chips 1 are also provided with bumps 37 for electrical connection to a grounding conductor pattern 38 also formed on the underside of the optical fiber array plate 31.

The drive ICs 22 have output pads 39 electrically connected to the output transmitting conductor pattern 36 via a group of bondwires W4. Further, the drive ICs 22 have input pads 40 electrically connected to a control conductor pattern 41 formed on the underside of the optical fiber array plate 31 via another group of bondwires W5.

The underside of the optical fiber array plate 31 is also provided with a protective resin member 42 enclosing the LED array chips 1 and the drive ICs 22. The protective resin member 42 strengthens electrical contact at the respective bumps 35, 37 while preventing the LED array chips 1 from oxidation. The protective resin member 42 has a void space X1 between the optical fiber array portion 33 and the LED array chips 1, so that light emission from the LED array chips 1 is not hindered.

As shown in FIG. 9, a connector 43 is attached to one longitudinal edge of the optical fiber array plate 31. The connector 43 has a plurality of leads 43a each of which may be in the form of a clip for clamping to the plate 31. To prevent removal of the connector 43 from the plate 31, a resin layer (not shown) may be applied to cover the leads 43a of the connector 43 on the underside of the plate 31.

Both surfaces of the optical fiber array plate 31 may be provided with light blocking films at suitable portions for preventing external light from entering to the void space X1.

In operation of the LED printhead 30, the light emitting portions 5 (FIGS. 1, 4 and 5) of the respective LED array chips 1 are selectively actuated for light emission in accordance with the drive outputs from the respective drive ICs 22. The emitted light passes through the optical fiber array portion 33 of the plate 31 axially of the respective optical fibers 33a to focus on the surface of a photosensitive medium 27, as indicated by an arrow L1 in FIG. 10. The optical fiber array portion 33 functions to form a non-inverted and non-magnified (non-reduced) image onto the photosensitive medium 27.

The LED printhead 30 illustrated in FIGS. 9 and 10 not only provides the same advantages as the printhead shown in FIG. 7 but also is additionally advantageous in that the thickness or height of the printhead can be greatly reduced by the use of the optical fiber array plate 31.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

I claim:

1. An LED array chip comprising:
   a common insulating substrate;
   a linear array of light emitting portions each of which includes a laminate of gallium nitride compound semiconductor layers formed on a surface of the common insulating substrate;
   a plurality of insulating grooves formed between the light emitting portions;
   an insulating member having a body portion formed on the common insulating substrate in side-by-side relation to the linear array of light emitting portions, the insulating member also having a plurality of extensions extending from the body portion into the insulating grooves for electrical separation between the light emitting portions; and
   a plurality of individual electrodes held in electrical connection with the light emitting portions, respectively, each of the individual electrodes extending onto a surface of the body portion of the insulating member and having a bonding pad on said surface of the body portion.

2. The LED array chip according to claim 1, wherein the laminate comprises an N-type GaN layer, an N-type $Al_{0.2}Ga_{0.8}N$ layer, an $In_{0.15}Ga_{0.85}N$ layer as a light emitting layer, a P-type $Al_{0.2}Ga_{0.8}N$ layer, and a P-type GaN layer, all of which are successively formed in the mentioned order from the substrate, whereby the $In_{0.15}Ga_{0.85}N$ light emitting layer generates light having a wavelength of no more than 550 nm.

3. The LED array chip according to claim 2, wherein the N-type GaN layer and the N-type $Al_{0.2}Ga_{0.8}N$ layer contain silicon as an additive, the P-type $Al_{0.2}Ga_{0.8}N$ layer and the P-type GaN layer containing magnesium as an additive, the $In_{0.15}Ga_{0.85}N$ light emitting layer containing zinc as an additive.

4. The LED array chip according to claim 2, wherein the N-type GaN layer of the laminate is partially exposed for forming a common electrode extending along an entire length of the array of light emitting portions, the P-type GaN layer of the laminate of each light emitting portion being held in electrical contact with a respective one of the individual electrodes.

* * * * *